United States Patent [19]

Matsuoka

[11] Patent Number: 5,045,923

[45] Date of Patent: Sep. 3, 1991

[54] CONTACT STRUCTURE IN SOCKET WITH IC CARRIER PLACED THEREON

[75] Inventor: Noriyuki Matsuoka, Tokyo, Japan

[73] Assignee: Yamaichi Electric MFG. Co., Ltd., Tokyo, Japan

[21] Appl. No.: 501,135

[22] Filed: Mar. 29, 1990

[30] Foreign Application Priority Data

Mar. 30, 1989 [JP] Japan ................. 1-79093

[51] Int. Cl.[5] ............... H01L 23/42; H01L 23/44; H01L 23/46; H01L 39/02
[52] U.S. Cl. .................................. 357/79; 357/80
[58] Field of Search ............................. 357/79, 80

[56] References Cited

U.S. PATENT DOCUMENTS

| | | | |
|---|---|---|---|
| 4,345,267 | 8/1982 | Corman et al. | 357/79 |
| 4,381,131 | 4/1983 | Demmianiuk | 357/79 |
| 4,435,724 | 3/1984 | Ralstin . | |
| 4,547,794 | 10/1985 | Tang . | |
| 4,745,456 | 5/1988 | Clemens | 357/79 |
| 4,887,149 | 12/1989 | Romano' . | |

FOREIGN PATENT DOCUMENTS 61-278159 12/1986 Japan .

Primary Examiner—Jerome Jackson, Jr.
Assistant Examiner—Carl Whitehead, Jr.
Attorney, Agent, or Firm—Wenderoth, Lind & Ponack

[57] ABSTRACT

A contact structure has an IC carrier for holding an IC package which is placed on a socket and contact pieces of the IC package held by the IC carrier which is to be contacted with contacts of the socket. The contact structure in the socket with the IC carrier placed on the socket is characterized in that it further includes contact pieces for allowing the contacts to be contacted with IC contact pieces from above under pressure and the IC carrier is held between the socket and the IC package by pressure contact force which is to be exerted against the IC contact pieces by the contact pieces of the contacts.

16 Claims, 6 Drawing Sheets

CONTACT STRUCTURE IN SOCKET WITH IC CARRIER PLACED THEREON

BACKGROUND OF THE INVENTION

1. Field of the Invention

This invention relates to a contact structure in a socket with an IC carrier placed thereon in which an IC package is held by the IC carrier and the IC carrier is placed on the IC socket in order to obtain a contact relation between the IC package and the IC socket.

2. Brief Description of the Prior Art

In general, an IC carrier holds an IC package in such a manner that contact pieces of the IC package are supported on an upper surface of a flat square frame and engaging claws are engaged with an edge portion of an IC package body.

Heretofore, there have been widely employed contact systems in which the IC package is placed on the socket together with the IC carrier without removing the IC package from the IC carrier in order to obtain a contact relation between the socket and the IC contact pieces.

In the prior art, the IC carrier for holding the IC package is inverted and placed on the socket in such a manner that the IC contact pieces and the upper surface of the frame are faced downward, said IC contact pieces being placed on the contacts arranged within the socket, the IC carrier being urged against the socket by a presser plate provided to the socket, so that the IC carrier is held by the socket by the pressing force and contact pressure between the contacts and contact pieces is obtained.

In such conventional socket with an IC carrier placed thereon as mentioned above, the IC carrier must be inverted each time when it is loaded on the socket and opening and closing operation of the presser plate and a lock lever must be carried out. Accordingly, it is difficult to automate the loading operation. Furthermore, as the IC package is sandwiched between the IC carrier and the socket and the presser plate is put thereon to cover, heat radiation of the IC package is badly decreased.

Although there is another device in which the carrier has the function of a presser plate, as strength is required for the carrier, weight is increased and an external configuration becomes large. Therefore, no improvement is made in respect to hindrance of heat radiation.

SUMMARY OF THE INVENTION

It is therefore a general object of the present invention to provide a contact structure in a socket with an IC carrier placed thereon which is capable of solving the above-mentioned problems and which is extensively simplified.

In order to achieve the above object, there is essentially provided a contact structure in which an IC carrier for holding an IC package is placed on a socket and contact pieces of said IC package held by said IC carrier are contacted with contacts of said socket. The contact structure in said socket with said IC carrier placed thereon is characterized in that it includes contact pieces for allowing said contacts to be contacted with IC contact pieces from thereabove under pressure. Also, the IC carrier is held between said socket and said IC package by pressure contact force which is to be exerted to said IC contact pieces by said contact pieces of said contacts.

From another aspect of the present invention, there is provided a contact structure in which an IC carrier for holding an IC package is placed on a socket, and contact pieces of said IC package held by said IC carrier are contacted with contacts of. The socket, said contact structure in said socket with said IC carrier placed thereon is characterized in that a frame of said IC carrier for supporting IC contact pieces of said IC package is provided with holes or grooves corresponding to said contact pieces. Each of said contacts is provided with a first contact piece adapted to contact with said IC contact piece from thereabove and a second contact piece adapted to contact with said IC contact piece from thereunder through. The hole or groove, said IC contact piece is pinched by said first contact piece and said second contact piece so that said IC package is held, to thereby hold said IC carrier between said socket and said IC package.

According to the present invention, the IC carrier holding the IC package is placed on the socket without being inverted. In the foregoing state, the contacts of the socket are contacted with the IC contact pieces from the upper surface side of the IC carrier and a pressing force accompanied by the contact is exerted to the IC carrier through the contact pieces. As a result, the IC carrier maintains the above-mentioned contact relation by being held on the socket by the pressing force of the contacts while permitting the IC package to be contacted with the socket.

Even if the contact structure of the present invention is constructed such that, while contacting the IC contact pieces with the first contact pieces of the contacts from thereabove, the second contact pieces are contacted with the IC contacting pieces from thereunder through holes or grooves formed in the frame of the IC carrier in order to hold the IC contact pieces. The IC carrier can be held by holding the IC package and a highly reliable contact relation can be obtained by the first contact pieces and the second contact pieces.

Other objects and advantages of the present invention will become more apparent during the course of the following description when taken in connection with the accompanying drawings.

BRIEF DESCRIPTION OF THE DRAWINGS

FIG. 1 is a perspective view, partly in section, showing an IC carrier. FIG. 2 is a perspective view, partly in section, showing the IC carrier with an IC package loaded thereon. FIG. 3 is a view showing the IC carrier immediately before it is loaded on the socket. FIG. 4 is a view showing a state where a contact opening and closing member is pressed down and the contact is moved backward and upward. FIG. 5 is a view showing a state where stopping of the pressing down operation of the contact opening and closing member is started and a contact portion of the contact is contacted with a tapered portion of the IC carrier. FIG. 6 is a view showing a state where the pressing down operational has been completely stopped and the contact portion climbs over the tapered portion and is contacted with the IC contact piece. FIG. 7 is a view showing another example of the IC carrier.

FIG. 8 is a perspective view of the IC carrier having a groove formed thereon. FIG. 9 is a perspective view of the IC carrier having holes formed in the frame. FIG. 10 is a sectional view of the socket on which IC carrier is placed in order to obtain a contact relation.

DETAILED DESCRIPTION OF THE EMBODIMENT

Figure 1:
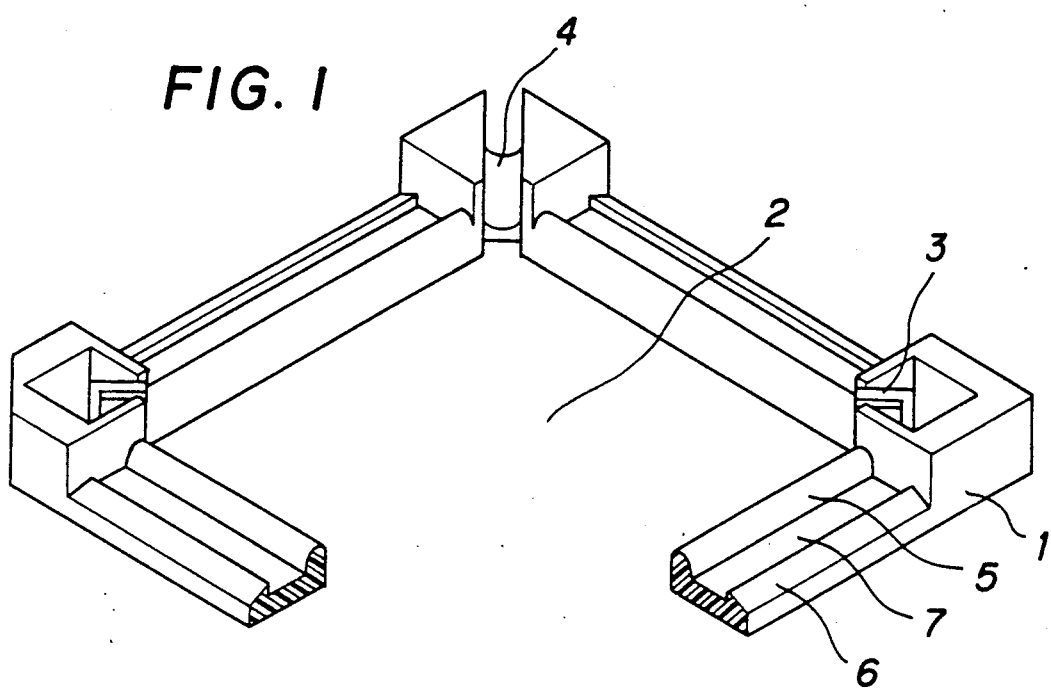
FIGS. 1 through 7 show a first embodiment of the present invention.

The embodiments of the present invention will be described in detail hereunder with reference to FIGS. 1 through 10.

FIRST EMBODIMENT (SEE FIGS. 1 THROUGH 7)

The reference numeral 1 denotes an IC carrier formed of a generally square frame. A generally square IC package accommodating portion 2 is formed in a central area defined by the frame. The IC carrier is provided with engaging claws, each of which is formed on an opposing corner portion (i.e. at opposing end of one of the diagonals between opposing carriers) and is adapted to hold the IC package 8 on the IC carrier 1. The remaining opposing corner portion are each provided with a U-shaped groove 4 so as to follow the IC carrier 1 to be bent against the resiliency of the carrier about the diagonal between the last-mentioned opposing corner. That is, by virtue of the provision of the U-shaped groove 4, the bottom wall of the U-shaped groove 4 can be formed thin to form a hinge bendable along the diagonal line at the thin portion to thereby make it possible to bend the IC carrier.

Also, an upper surface of each of the four side of the frame around the IC package accommodating portion 2 has a projection 5 extending in the extending direction of the frame and adapted to position the IC package 8. A tapered portion 6 is formed on an outer edge side of the projection 5 in such a manner as to have a downward gradient toward the outer side, thereof and a contact piece supporting seat 7 is formed between the taper portion 6 and the projection 5.

Figure 2:
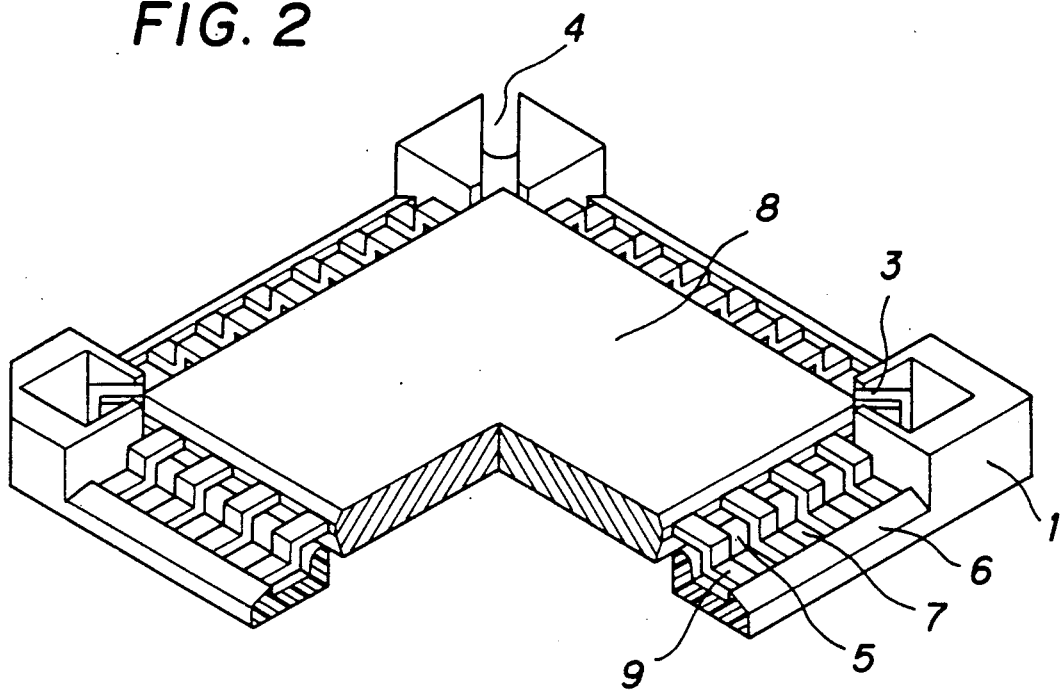

FIG. 2 shows a state where the IC package 8 is held by the IC carrier 1 constructed as mentioned above.

The IC package 8 has a number of contact pieces 9 projecting sideward from each of its four sides. Each of the contact pieces 9 is bent in a generally hook shape at its inner side and bent in a generally reversed hook shape at its leading end side. When the IC package 8 is accommodated in the accommodating portion 2 of the IC carrier 1, the projection 5 is located within the generally hook-shaped bent portion on its inner side and the generally reversed hook-shaped bent piece on its leading end side is supported by the contact piece supporting seat 7. The retaining claws 3 are engaged with the angular portions of the IC package 8 so that the IC package 8 is held by the IC carrier 1.

In order to have the IC package 8 held by the IC carrier 1, the IC carrier 1 is bent along the U-shaped grooves 4 to open the engaging claws 3 and after the IC package 8 is accommodated, the IC carrier 1 is restored to cause the retaining claws 3 to be engaged with the edge portion of the IC package 8.

Figure 3:
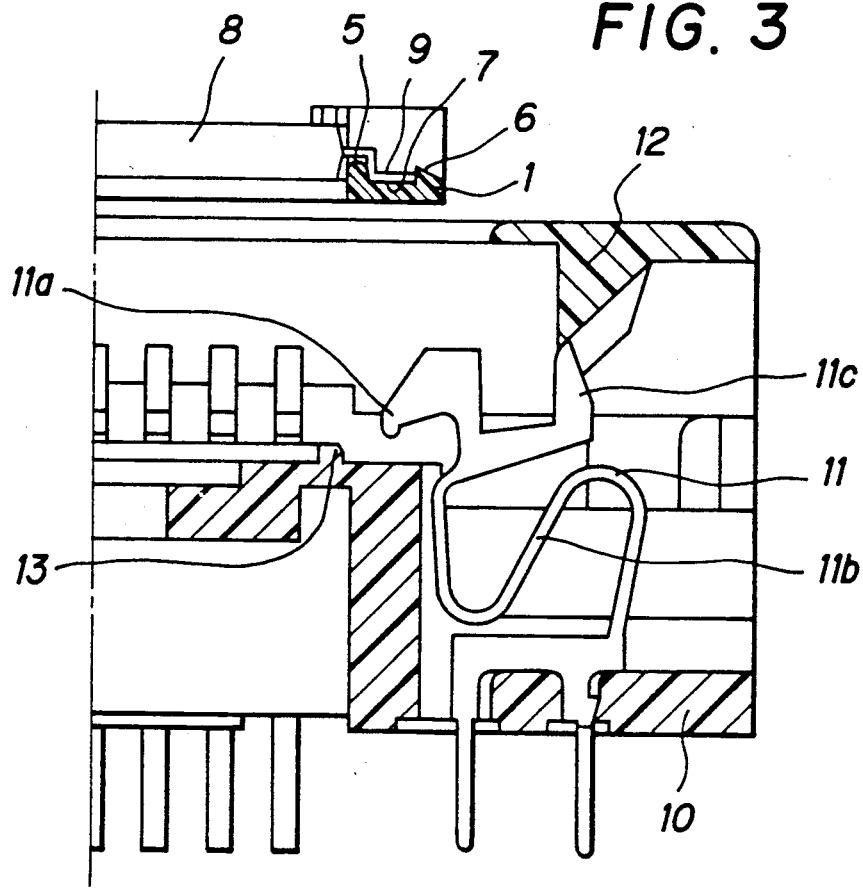

Next, in order to obtain a contact relation by placing the IC carrier 1 holding the IC package 8 on the IC socket 10, first in the state of FIG. 3, the opening and closing member 12 held by the IC socket 10 is pressed down to to move the contact 11 backwardly and upwardly against the resiliency. Its own contact 11 has a contact portion 11a at an upper end portion of a curved spring piece forming the contact piece 11b and an arm 11c extending backward from the upper end portion of the curved spring piece. The contact 11 is moved backward and upward by pressing down the arm 11c with the contact opening and closing member 12.

Figure 4:
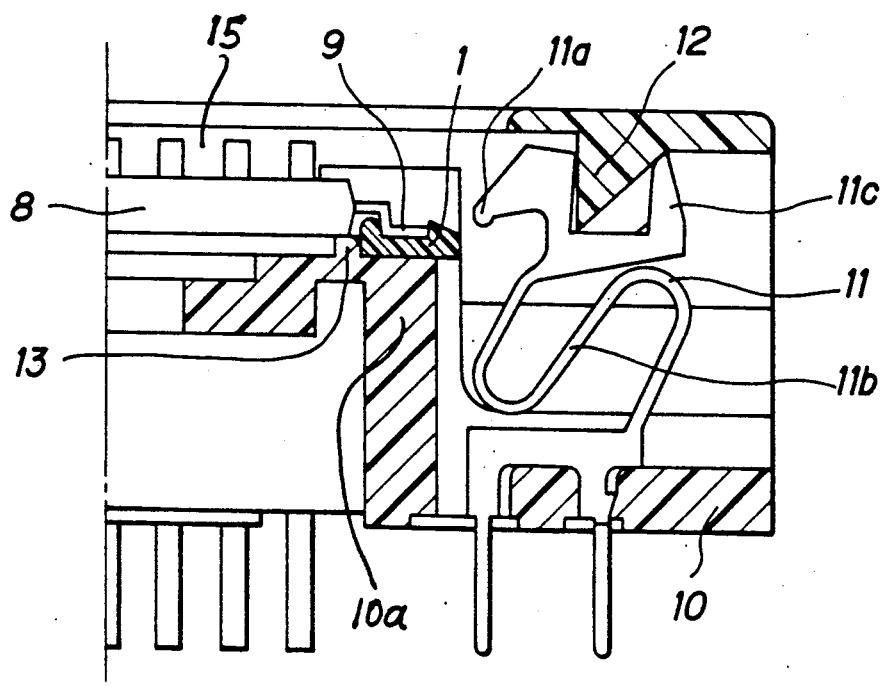

Next, as is shown in FIG. 4, the IC carrier 1 holding the IC package 8 is accommodating in the IC carrier accommodating portion 15 opened in the central portion of an upper surface of the IC socket 10 and the IC carrier 1 is placed on the supporting wall 10a at the inner bottom of the IC carrier accommodating portion 15. The supporting wall 10a is provided with a positioning wall 13 adapted to guide the inner surface of the frame of the IC carrier 1 so that the IC carrier is positioned.

Figure 5:
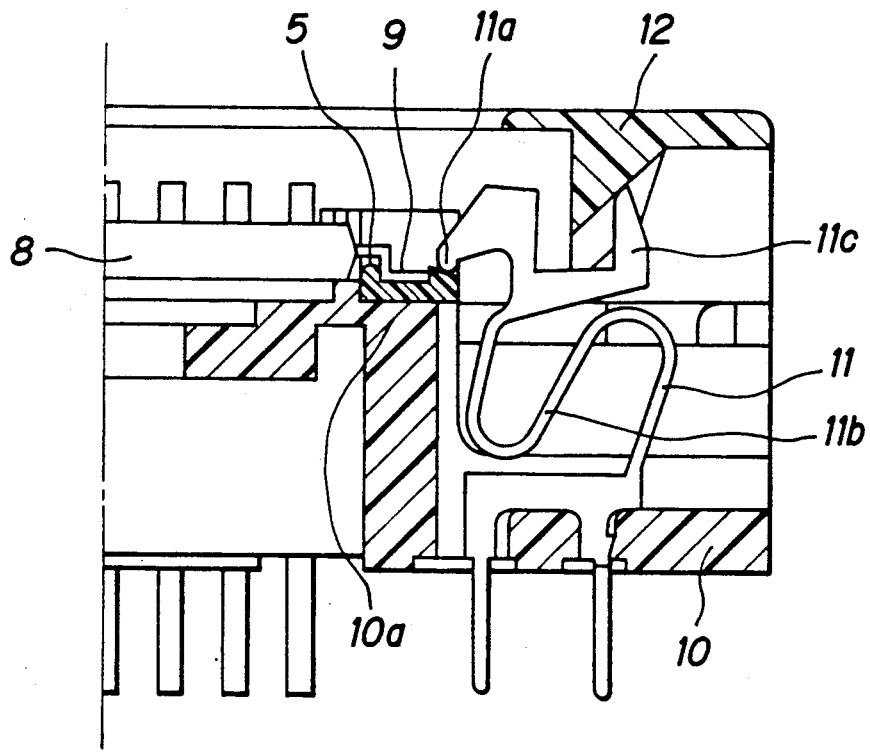
Figure 6:
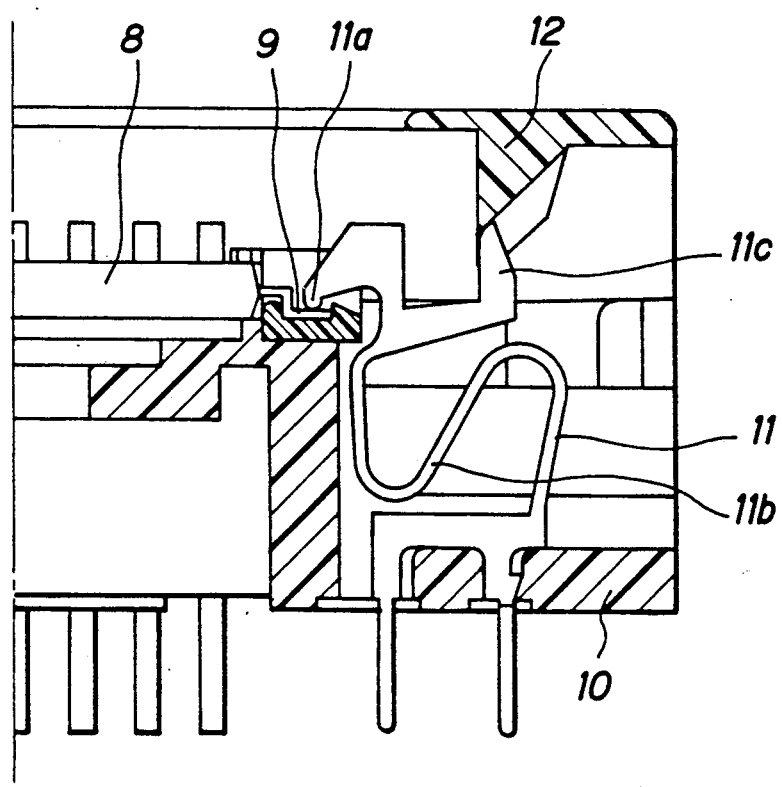

Next, as is shown in FIGS. 5 and 6, when the downward pressing force exerted against the contact opening and closing member 12 is removed, the contact 11 is restored by its own to its normal position and the contact portion 11a is caused to slide and climb over the tapered portion 6 in order to resiliently contact the IC contact piece 9 from above.

In this way, the IC contact piece 9 of the IC package 8 can obtain a favorable electrical contact from above with the contact 11 by means of pressure contact, and the pressing force of the resilient contact 11 is exerted against the four sides of the frame of the IC carrier 1 such that the IC carrier 1 is held by the socket 10.

Figure 7:
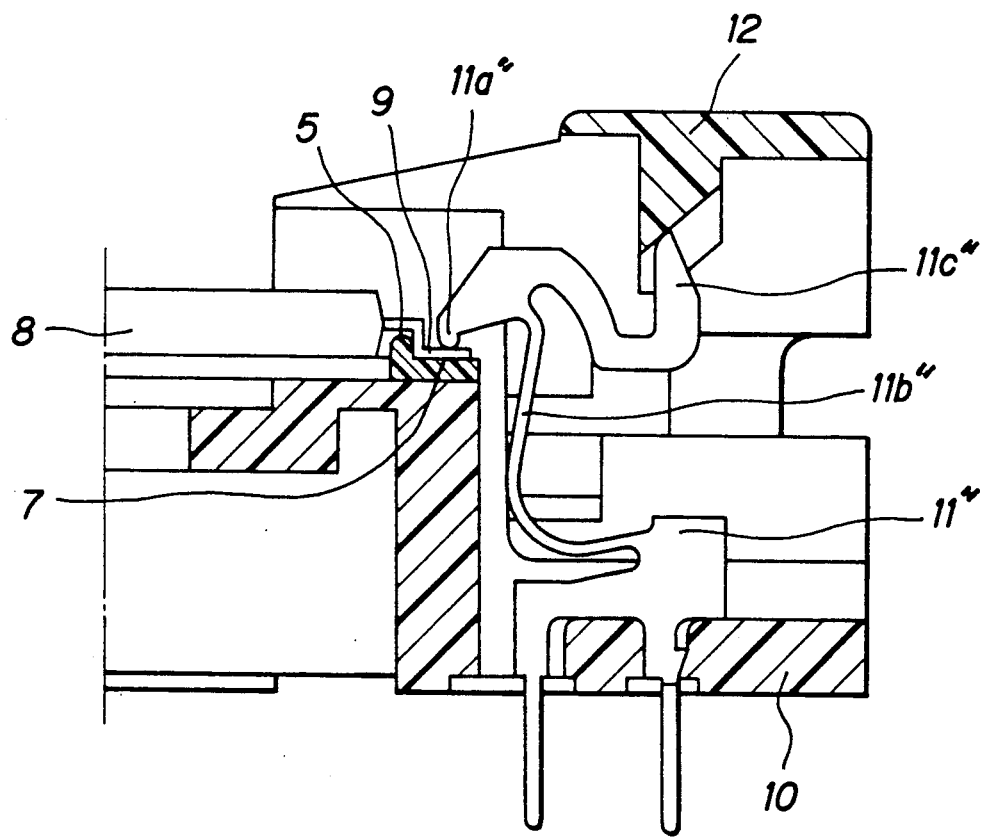
Figure 8:
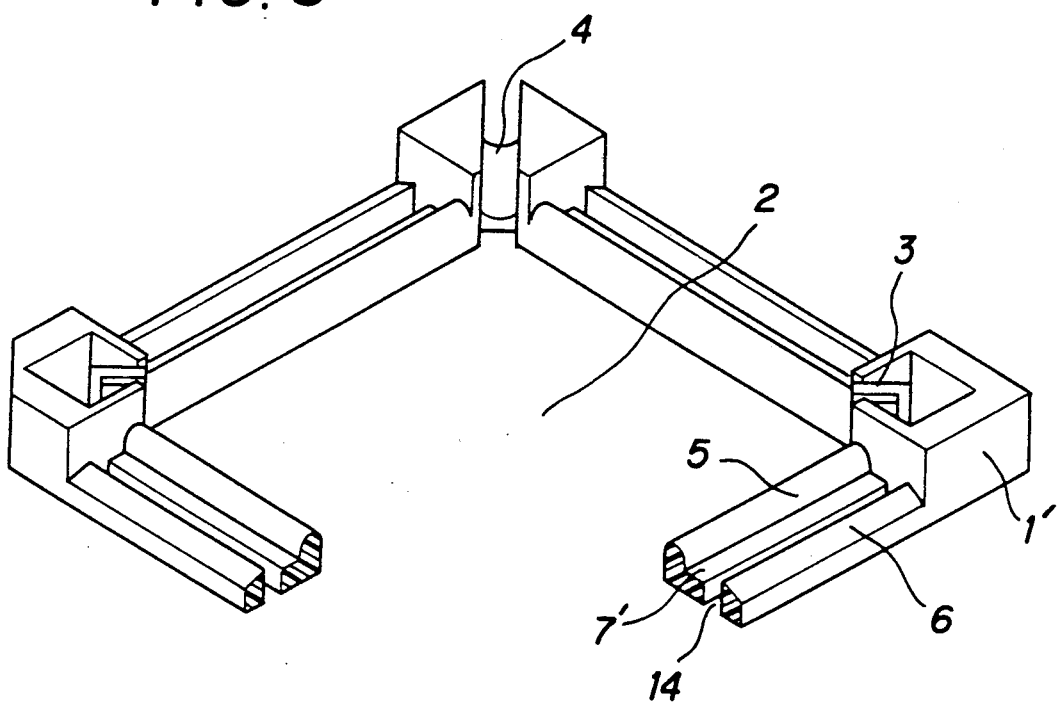
FIGS. 8 through 10 show a second embodiment of the present invention.
Figure 9:
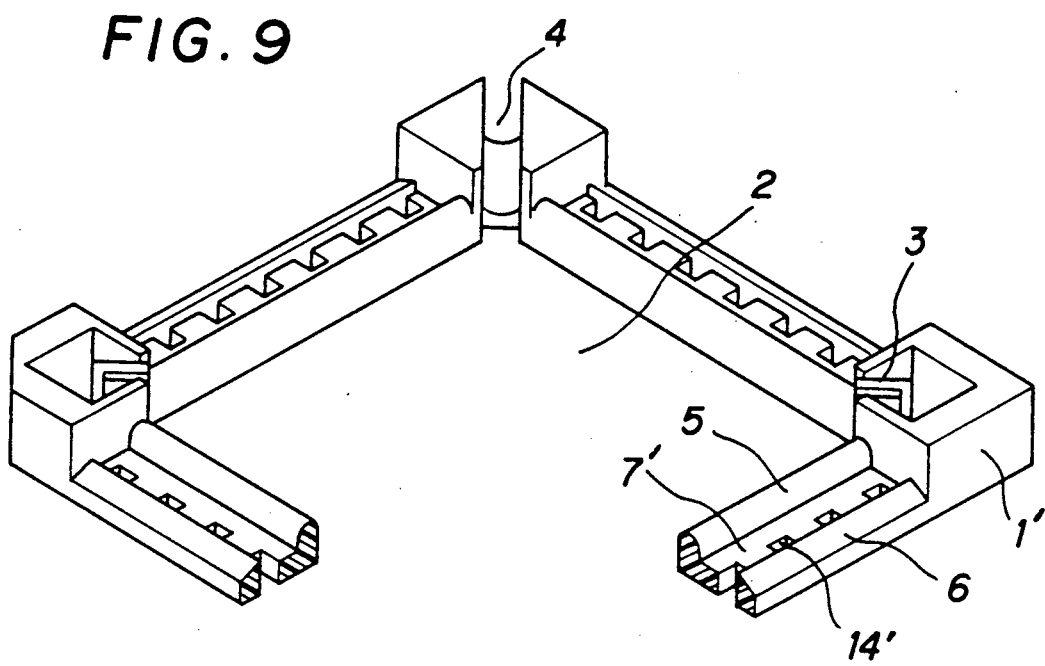

As is shown in FIG. 7, it may be designed such that the frame of the IC carrier 1 is not provided with the tapered portion 6, and the contact portion 11a" of the contact 11" is moved backward in such manner as to move the contact 11" upward so that the contact portion 11a", when returning, directly contacts with the contact piece 9 from above without riding over the tapered portion 6.

In order to cancel the contact relation between the contact 11" and the IC contact piece 9, the contact opening and closing member 12 is pressed down again and the IC carrier 1 is removed in a state where the contact 11 is moved backward and upward. As the socket of FIGS. 3 through 7 is laterally symmetrical, the other half part is omitted from the drawings.

SECOND EMBODIMENT (SEE FIGS. 8 THROUGH 10)

Figure 10:
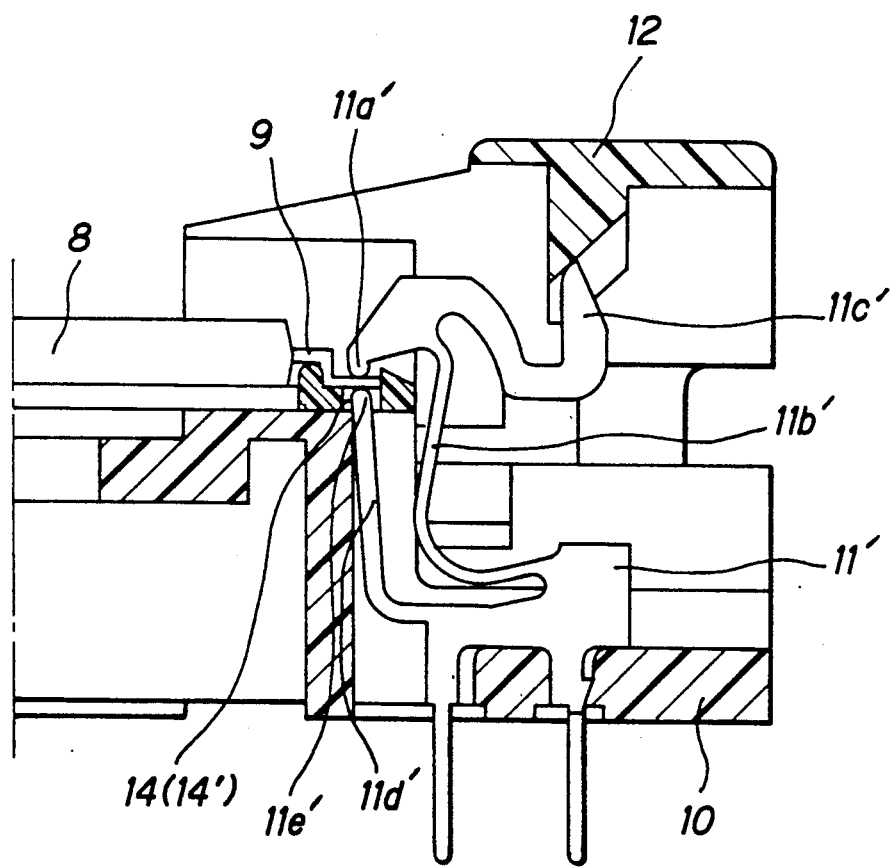

In this embodiment, the contact piece supporting seat 7' of the IC carrier 1' described in the first embodiment is provided with a groove 14 (see FIG. 8) extending along each side of the frame or with holes 14' (see FIG. 9) corresponding to the IC contact pieces 9. On the other hand, as is shown in FIG. 10, the contact 11' is provided with a first contact piece 11b' adapted to contact at its contact portion 11a' with the IC contact pieces 9 from and a second contact piece 11d' is adapted to contact at its contact portion 11e' with the IC contact piece 9 from below through the hole 14' and the groove 14 respectively. A downward pressing force of the first contact piece 11b' is made larger than a upward pressing force of the second contact piece 11d' so that the IC carrier 1' is held between the socket 10 and the IC package 8 by the downward pressing force exerted against the contact piece 9 by the first contact piece 11b'. At the same time, the IC contact piece 9 is vertically held between the first and the second contact pieces 11b and 11d in order to obtain a favorable contact relation.

In other words, in the case of this embodiment, the IC contact piece 9 are held between the first and the second contact pieces 11b' and 11d' so that the IC package 8 is also held thereby to thereby hold the IC carrier 1 between the IC package 8 and the socket 10.

Also, it may be designed such that when the IC carrier 1' is placed on the socket 10, the contact portion 11e' of the second contact piece 11d' is slightly projected upward from the hole 14' or the groove 14 and the IC contact piece 9 is held between the first and the second contact pieces 11b' and 11d'', thereby the IC carrier 1' is interposed between the IC package 8 and the socket 10 in order to hold the same. In this case, the IC carrier 1' may be interposed with a small amount of play.

As described in the foregoing, according to the present invention, the IC carrier holding the IC package can be placed on the socket without inverting the IC carrier and in the foregoing state, a favorable contact relation can be obtained between the contact of the socket and the IC contact piece of the IC package. At the same time, a pressing force of the contact for contacting with the IC contact piece from the upper surface side of the carrier is exerted against the IC carrier through the contact piece. As a result, the IC carrier is held on the socket by means of the pressing force of the contact. That is, the IC carrier holds the IC package at the opened upper surface of the socket to as to be ready for contacting and the socket is held by the contact for contacting.

Also the same function and effect can be obtained even if it is designed such that the first contact piece of the contact is caused to contact with the IC contact piece from above, and the second contact piece is caused to contact with the IC contact piece from below through the holes or grooves formed in the frame of the IC carrier. Therefore, a highly reliable contact relation can be obtained by and first and the second contact pieces.

Furthermore, as there can be employed a structure in which the IC carrier is placed on the socket without inverting the IC carrier and the contact is moved to an upper surface of the IC contact in order to obtain a contact relation therebetween to thereby hold the IC carrier, automation for obtaining a contact relation and cancellation of the contact relation becomes very easy. In addition, as the IC package is caused to contact with the socket in its opened state with respect to the socket, the heat radiation effect is very favorable. As the IC carrier itself functions as a presser plate the strength requirements are less than in the prior art therefore, the IC carrier can be made small in size and light in weight.

While the present invention has been described in its preferred embodiments, it is to be understood that various changes and modifications will occur to those skilled in the art without departing from the spirit of the invention. Therefore, the scope of the invention is to be determined solely by the appended claims.

What is claimed is:

1. An apparatus comprising:
  an IC package having a plurality of contact pieces extending outwardly therefrom;
  an IC carrier frame having an accommodating portion defined therein for accommodating said IC package and having an upper surface with means thereon for receiving said plurality of contact pieces of said IC package when said IC package is accommodated in said IC package accommodating portion; and
  an IC socket having an IC carrier frame accommodating portion for accommodating said IC carrier frame, and contact means for electrically contacting said contact pieces of said IC package when said IC package is accommodated in said IC package accommodating portion of said IC carrier frame and said IC carrier frame is accommodated in said IC carrier frame accommodating portion of said IC socket.

2. An apparatus as recited in claim 1, wherein
said receiving means comprises a seat and an upwardly extending projection adjacent said seat, and receiving means and said contact pieces of said IC package being substantially complementary with one another.

3. An apparatus as recited in claim 2, wherein
said receiving means further comprises an upwardly extending tapered portion adjacent said seat and on an opposite side of said seat with respect to said projection.

4. An apparatus as recited in claim 2, wherein
said frame has a groove formed therein extending downwardly from said seat and through a bottom surface of said frame.

5. An apparatus as recited in claim 1, wherein
said contact means of said IC socket is further operable for securing said IC package and said IC carrier frame in said IC carrier frame accommodating portion of said IC socket.

6. An apparatus as recited in claim 5, wherein
said contact means comprises at least one resilient portion and at least one upper contact portion respectively integral with said at least one resilient portion, said contact means being movable between a normal rest position in which said at least one upper contact portion contacts an upper surface of at least one of said plurality of contact pieces of said IC package when said IC carrier frame and said IC package are accommodated in said IC carrier frame accommodating portion and a second position in which said at least one upper contact portion is spaced from said normal rest position.

7. An apparatus as recited in claim 6, further comprising
an opening/closing means for forcing said contact means from said normal rest position into said second position so as to allow said IC package and IC carrier frame to be loaded into or removed from said IC carrier frame accommodating portion of said IC socket.

8. An apparatus as recited in claim 6, wherein
said receiving means comprises a seat and an upwardly extending projection adjacent said seat, said receiving means and said contact pieces of said IC package being substantially complementary with one another; and
said frame has a groove formed therein extending downwardly from said seat and through a bottom surface of said frame.

9. An apparatus as recited in claim 6, wherein said receiving means comprises a seat and an upwardly extending projection adjacent said seat, said receiving means and said contact pieces of said IC package being substantially complementary with one another; and
  said frame has a plurality of holes formed therein extending downwardly from said seat and through a bottom surface of said frame, said holes being positioned along said frame in locations corresponding to locations of respective ones of said plurality of contact pieces of said IC package when said IC package is accommodated in said IC package accommodating portion of said IC carrier frame.

10. An apparatus as recited in claim 8, wherein said contact means further comprises at least one lower contact portion respectively integral with said at least one resilient portion for extending through said groove and contacting a bottom surface of at least one of said plurality of contact pieces respectively, of said IC package when said IC carrier frame and said IC package are accommodated in said IC carrier frame accommodating portion and said contact means is in said normal rest position.

11. An apparatus as recited in claim 10, wherein said at least one lower contact portion contacts said lower surface of said at least one contact piece, respectively, of said IC package with less upward force than said at least one upper contact portion contacts said upper surface thereof, respectively, with a downward force when said IC carrier frame and said IC package are accommodated in said IC carrier frame accommodating portion of said IC socket and said contact means is in said normal rest position. with one another; and
said frame has a plurality of holes formed therein extending downwardly from said seat and through a bottom surface of said frame, said holes being positioned along said frame in locations corresponding to locations of respective ones of said plurality of contact pieces of said IC package when said IC package is accommodated in said IC package accommodating portion of said IC carrier frame.

12. An apparatus as recited in claim 9, wherein said contact means further comprises at least one lower contact portion respectively integral with said at least one resilient portion for extending respectively through said plurality of holes and contacting a bottom surface of at least one of said plurality of contact pieces, respectively, of said IC package when said IC carrier frame and said IC package are accommodated in said IC carrier frame accommodating portion and said contact means is in said normal rest position.

13. An apparatus as recited in claim 12, wherein said at least one lower contact portion contacts said lower surface of said at least one contact piece, respectively, of said IC package with less upward force than said at least one upper contact portion contacts said upper surface thereof, respectively, with downward force when said IC carrier frame and said IC package are accommodated in said IC carrier frame accommodating portion of said IC socket and said contact means is in said normal rest position.

14. An apparatus as recited in claim 1, wherein said IC carrier frame is substantially rectangular such that it defines four side portion which surround said IC package accommodating portion.

15. An apparatus as recited in claim 1, wherein said IC socket includes a supporting wall with an upper surface on which said contact pieces of said IC package are adapted to rest when said IC package is accommodated in said IC package accommodating portion of said IC carrier frame and said IC carrier flame is accommodated in said IC carrier frame accommodating portion of said IC socket; and
said contact means is operable to clamp said contact pieces of said IC package against said upper surface of said supporting wall.

16. An apparatus comprising:
an IC package having a plurality of contact pieces extending outwardly therefrom;
an IC carrier frame having an accommodating portion defined therein for accommodating said IC package and having an upper surface with means thereon for receiving said plurality of contact pieces of said IC package when said IC package is accommodated in said IC package accommodating portion;
wherein said receiving means comprises a seat and an upwardly extending projection adjacent said seat, said receiving means and said contact pieces of said IC package being substantially complementary with one another; and
wherein said frame has a plurality of holes formed therein extending downwardly from said seat and through a bottom surface of said frame, said holes being positioned along said frame in locations corresponding to locations of respective ones of said plurality of contact pieces of said IC package when said IC package is accommodated in said IC package accommodating portion of said IC carrier frame.

* * * * *